(12) United States Patent
Noorbakhsh et al.

(10) Patent No.: US 11,171,030 B2
(45) Date of Patent: Nov. 9, 2021

(54) METHODS AND APPARATUS FOR DECHUCKING WAFERS

(71) Applicant: APPLIED MATERIALS, INC., Santa Clara, CA (US)

(72) Inventors: Hamid Noorbakhsh, Fremont, CA (US); Anwar Husain, Pleasanton, CA (US); Haitao Wang, Fremont, CA (US); Sergio F Shoji, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 34 days.

(21) Appl. No.: 16/403,850

(22) Filed: May 6, 2019

(65) Prior Publication Data

US 2020/0357675 A1 Nov. 12, 2020

(51) Int. Cl.
*H01L 21/683* (2006.01)
*H01J 37/32* (2006.01)
*H01L 21/67* (2006.01)

(52) U.S. Cl.
CPC .... *H01L 21/6833* (2013.01); *H01J 37/32715* (2013.01); *H01L 21/67069* (2013.01); *H01L 21/67253* (2013.01)

(58) Field of Classification Search
CPC ........... H02L 21/6833; H02L 21/68742; H01J 37/32715; H01J 37/32697; H01L 21/67069; H01L 21/67253; H01H 9/54
See application file for complete search history.

(56) References Cited

U.S. PATENT DOCUMENTS

| | | | |
|---|---|---|---|
| 10,546,731 B1* | 1/2020 | Wang | H01L 22/14 |
| 2005/0225923 A1* | 10/2005 | Howald | H01L 21/6833 |
| | | | 361/234 |
| 2007/0285869 A1* | 12/2007 | Howald | H01L 21/6831 |
| | | | 361/234 |
| 2008/0285202 A1* | 11/2008 | Boyd | H01L 21/67253 |
| | | | 361/234 |
| 2010/0208409 A1* | 8/2010 | Bluck | H01L 21/683 |
| | | | 361/234 |
| 2013/0153147 A1* | 6/2013 | Senzaki | H01L 21/6831 |
| | | | 156/345.26 |
| 2015/0303092 A1* | 10/2015 | Kawabata | H02N 13/00 |
| | | | 361/234 |
| 2018/0182656 A1 | 6/2018 | Sato | |
| 2019/0074209 A1 | 3/2019 | Sasaki et al. | |
| 2020/0075389 A1 | 3/2020 | Tian et al. | |

* cited by examiner

*Primary Examiner* — Adolf D Berhane
(74) *Attorney, Agent, or Firm* — Moser Taboada

(57) ABSTRACT

Methods and apparatus for dechucking a wafer from a surface of an electrostatic chuck (ESC). In some embodiments, a method comprises reducing a pressure of a gas applied to a backside of the wafer to approximately zero psi; reducing a downward pressure in a cylinder bore of a lifting actuator to approximately atmospheric pressure while a processing volume of the processing chamber is in a vacuum state to create a constant upward force on the wafer, the constant upward force less than a breaking force of the wafer; and sweeping a voltage applied to the ESC to dechuck the wafer; and monitoring a sensor on the lifting actuator that is interposed between a chucking position of the lifting actuator and a transfer position of the lifting actuator to detect when the wafer is dechucked.

20 Claims, 4 Drawing Sheets

METHODS AND APPARATUS FOR DECHUCKING WAFERS

FIELD

Embodiments of the present principles generally relate to semiconductor processing.

BACKGROUND

A plasma process is often performed in vacuum by evacuating gas from a processing chamber. In such a process, a wafer is placed on an electrostatic chuck (ESC) that is arranged on a stage of the processing chamber. The electrostatic chuck includes a conductive sheet-type chuck electrode that is arranged between dielectric members. When performing a plasma process, a voltage from a direct voltage source is applied to the electrostatic source so that the wafer is chucked to the electrostatic chuck by a Coulomb force generated from the voltage application. After the plasma process is completed, the voltage applied to the electrostatic chuck is typically turned off so that the wafer may be dechucked from the electrostatic chuck. In some instances, to dechuck the wafer, a discharge process is performed, which involves introducing inert gas into the processing chamber to maintain the pressure within the processing chamber at a predetermined pressure level, applying a voltage of the opposite polarity with respect to the voltage applied to the electrostatic chuck during the plasma process, and then turning off the voltage application so that the electric charges of the electrostatic chuck and the wafer may be discharged. Then, support pins are raised so that the wafer may be lifted and dechucked from the electrostatic chuck.

However, the surface of the electrostatic chuck can change over time. For example, foreign substances such as reactive products generated during the plasma process may gradually build up on the surface of the electrostatic chuck to form an insulating film. In such a case, an electric charge may accumulate in the insulating film so that even when the voltage applied to the electrostatic chuck is turned off, a residual electrical charge may remain on the surface of the electrostatic chuck. Such a residual electric charge cannot be discharged by the above discharge process. As a result, the support pins can be raised while an electrostatic suction force created by the residual electric charge still remains on the surface of the electrostatic chuck, damaging the wafer.

Accordingly, the inventors have provided improved methods and apparatus for eliminating or reducing damage to a wafer when dechucking the wafer.

SUMMARY

Methods and apparatus for reducing breakage of wafers during semiconductor processing are provided herein.

In some embodiments, a method for dechucking a wafer from a surface of an electrostatic chuck (ESC) in a processing chamber comprises sweeping a voltage applied to the ESC to dechuck the wafer and applying a constant upward force to a backside of the wafer chucked in the ESC with a lifting actuator prior to an occurrence of an ESC current spike caused by the sweeping of the voltage applied to the ESC, the constant upward force less than a breaking force of the wafer.

In some embodiments, the method may further include monitoring a sensor on the lifting actuator that is interposed between a chucking position of the lifting actuator and a transfer position of the lifting actuator to detect when the wafer is dechucked; wherein the constant upward force is provided by atmospheric pressure applied to a cylinder bore of the lifting actuator; wherein the constant upward force is increased by up to approximately 1 psi above atmospheric pressure; detecting a current spike of an ESC current during the sweeping of the voltage applied to the ESC and increasing the constant upward force to the backside of the wafer by increasing an upward pressure in a cylinder bore of the lifting actuator to up to approximately three psi when the current spike is detected; reducing a pressure of a gas applied to the backside of the wafer to approximately zero psi and applying the constant upward force to the wafer prior to the sweeping of the voltage applied to the ESC; wherein the constant upward force exerts up to approximately 5 pounds of force applied to the wafer; wherein the lifting actuator is a low friction air cylinder; wherein the low friction air cylinder has a glass cylinder liner and a graphite piston seal; and/or reducing a downward pressure on a cylinder bore of the lifting actuator to approximately atmospheric pressure while a processing volume of the processing chamber is in a vacuum state to provide the constant upward force on the wafer.

In some embodiments, a method for dechucking a wafer from a surface of an electrostatic chuck (ESC) in a processing chamber comprises reducing a pressure of a gas applied to a backside of the wafer to approximately zero psi; reducing a downward pressure in a cylinder bore of a lifting actuator to approximately atmospheric pressure while a processing volume of the processing chamber is in a vacuum state to create a constant upward force on the wafer, the constant upward force less than a breaking force of the wafer; and sweeping a voltage applied to the ESC to dechuck the wafer.

In some embodiments, the method may further include detecting a current spike of an ESC current during the sweeping of the voltage applied to the ESC and increasing the constant upward force to the backside of the wafer by increasing an upward pressure in a cylinder bore of the lifting actuator to less than approximately three psi when the current spike is detected; monitoring a sensor on the lifting actuator that is interposed between a chucking position of the lifting actuator and a transfer position of the lifting actuator to detect when the wafer is dechucked; wherein the constant upward force is increased by approximately 1 psi or less above atmospheric pressure; wherein the constant upward force exerts up to approximately 5 pounds of force applied to the wafer; wherein the lifting actuator is a low friction air cylinder; wherein the low friction air cylinder has a glass cylinder liner and a graphite piston seal; and/or wherein the low friction air cylinder operates with approximately 0.2 psi or less.

In some embodiments, an apparatus for dechucking a wafer from a surface of an electrostatic chuck (ESC) in a processing chamber comprises a processing chamber comprising an ESC, and a plurality of support pins to support the wafer; a current monitor to monitor a current of the ESC; a power source to provide a voltage to the ESC; and a controller comprising a processor and a memory coupled to the processor, the memory having stored therein at least one of programs or instructions executable by the processor to configure the controller to reduce a pressure of a gas applied to a backside of the wafer to approximately zero psi; reduce a downward pressure in a cylinder bore of a lifting actuator to approximately atmospheric pressure while a processing volume of the processing chamber is in a vacuum state to create a constant upward force on the wafer, the constant upward force less than a breaking force of the wafer; and sweep a voltage applied to the ESC to dechuck the wafer.

In some embodiments, the apparatus may further include a controller further configured to detect a current spike of an ESC current during the sweep of the voltage applied to the ESC; increase the constant upward force to the backside of the wafer by increasing an upward pressure in a cylinder bore of the lifting actuator to less than approximately three psi when the current spike is detected; and monitor a sensor on the lifting actuator that is interposed between a chucking position of the lifting actuator and a transfer position of the lifting actuator to detect when the wafer is dechucked.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
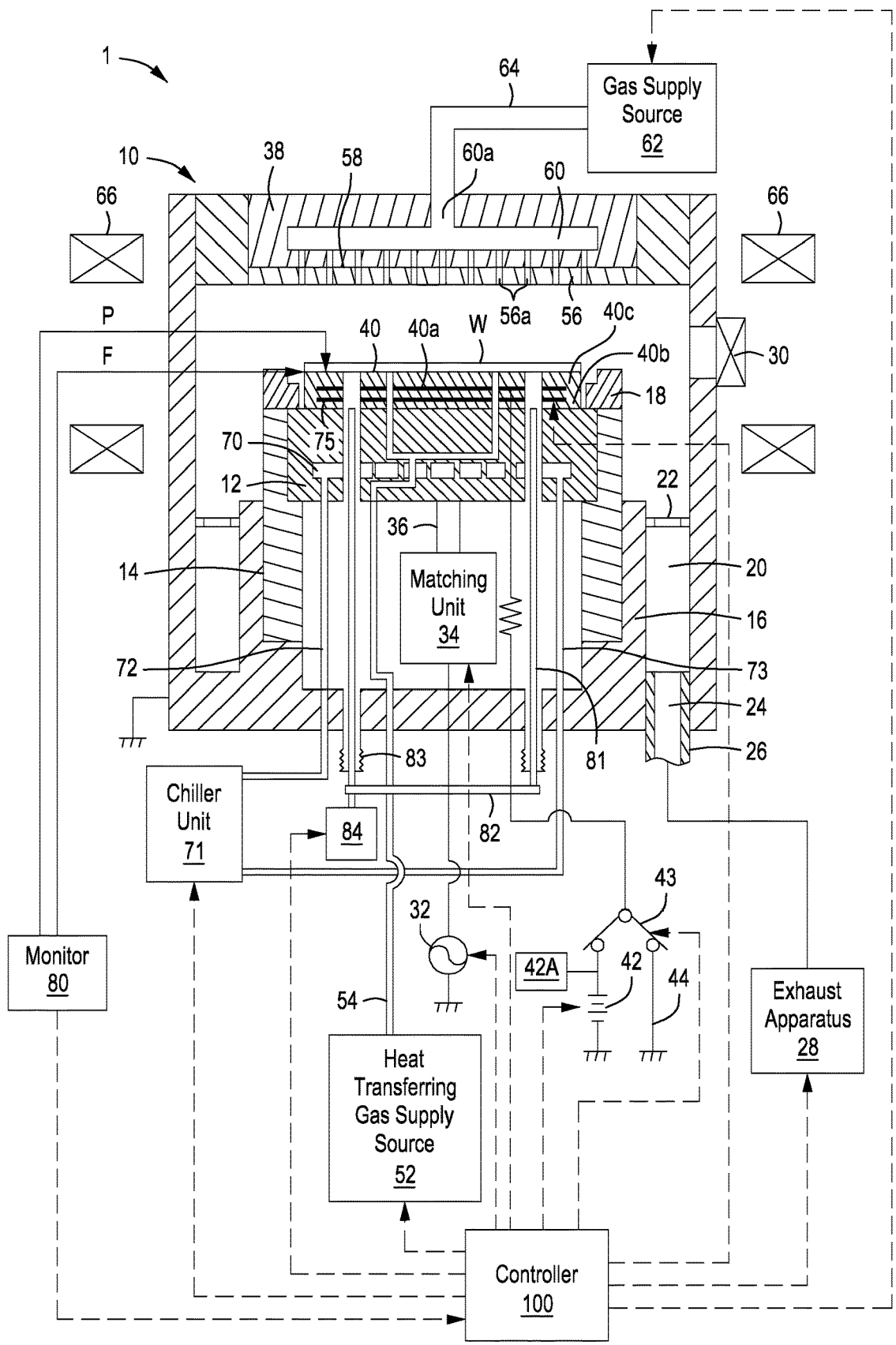
FIG. 1 is a cross-sectional view of a plasma processing system in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide a decreased breakage of wafers when using an electrostatic chuck (ESC). When lifting forces are applied to a wafer, the forces are large enough to break or damage the wafer if an electrical charge on the ESC is significant enough to retain (chuck) the wafer. Delays between the time the electrical charge is zeroed on the ESC and the time when the lifting force is applied may cause the lifting force to be asserted when the wafer is chucked (electrical charge is non-zero). By applying a low lifting force prior to a zeroing of the electrical charge, at the moment that the electrical charge reaches zero, the low lifting force is present and dechucks the wafer. The low lifting force is less than a breakage force of the wafer and does not damage the wafer when the wafer is chucked. However, the low lifting force is large enough to lift the wafer when the electrical charge is zeroed, leaving the wafer undamaged. Because the low lifting force does not damage a chucked wafer, a dechucking process may be repeated until the wafer is dechucked without any wafer damage. Advantageously, wafer breakages that occur after processes that are correlated to a wafer backside coating, ESC surface condition, and variabilities in manufacturing are reduced or eliminated, decreasing a major cost in device loss, tool down time, and damages to expensive parts inside a process chamber or reactor.

In some embodiments, a lift actuator provides a continuous force from lift pins to a back of a wafer immediately after completion of a semiconductor process and before de-chucking to insure immediate removal of the wafer anytime during the dechucking process. In addition, since the upward pressure on the wafer is applied by the lifting actuator during a dechucking process, there is no need for an electronic valve (EV) or solenoid to control the down position forces in the lifting actuator. In some embodiments, a controller may accept feedback from a sensor on the lift actuator that detects when the lift actuator moves from an ESC chucking position (low position) towards a transfer position (high position) for robot pick up of the wafer. In some embodiments, atmospheric pressure is used for dislodging (dechucking) the wafer and provides a consistent lift force at a considerably lower cost. In some embodiments, a pressure regulator may be used to apply a minimal force beyond atmospheric pressure to increase lifting speed without damaging or breaking the wafer.

FIG. 1 is a cross-sectional view of a plasma processing system 1 in which some embodiments of the present principles may be applied. The plasma processing system 1 embodies an RIE (reactive-ion etching) type plasma processing system including a cylindrical chamber (processing chamber 10) made of metal such as aluminum or stainless steel, for example. The processing chamber 10 is grounded. The processing chamber 10 is depicted with a semiconductor wafer W (referred to as "wafer, W," hereinafter) arranged on a stage 12. The stage 12 can be made of aluminum, for example, and is supported by a tubular support 16 extending upward in a perpendicular direction from the bottom of the processing chamber 10 via an insulating tubular holder 14. A focus ring 18 made of quartz, for example, that forms a circle around the top face of the stage 12 is arranged on the top face of the tubular holder 14.

The inner wall of the processing chamber 10 and the outer wall of the tubular support 16 form an exhaust path 20. A circular baffle plate 22 is arranged over the exhaust path 20. An exhaust opening 24 is arranged at the bottom portion of the exhaust path 20 and is connected to an exhaust apparatus 28 via an exhaust pipe 26. The exhaust apparatus 28 includes a vacuum pump (not shown) and is configured to depressurize the interior of the processing chamber 10 to a predetermined degree of vacuum. A gate valve 30 that opens and closes when the wafer, W, is transported into and out of the processing chamber 10 is arranged at the side wall of the processing chamber 10. The stage 12 is electrically connected to a high-frequency power source 32 for generating plasma via a power feed rod 36 and a matching unit 34. The high-frequency power source 32 can apply a high-frequency electric power of 60 MHz, for example, to the stage 12. The stage 12 can also function as a lower electrode. A shower head 38 as an upper electrode at ground potential is arranged at the ceiling portion of the processing chamber 10. The plasma generating high-frequency electric power from the high-frequency power source 32 is capacitively applied between the stage 12 and the shower head 38.

The stage 12 has an electrostatic chuck 40 arranged on an upper face of the stage 12 for holding the wafer, W, in place with electrostatic suction force. The electrostatic chuck 40 includes a sheet-type chuck electrode 40*a* made of a conductive film that is arranged between dielectric layers 40*b* and 40*c* corresponding to a pair of dielectric members. A direct current voltage source 42 is connected to the chuck electrode 40*a* via a switch 43. When the voltage from the direct current voltage source 42 is turned on, the electrostatic chuck 40 attracts the wafer, W, with a Coulomb force to hold the wafer, W, in place. When the voltage applied to the chuck electrode 40*a* is turned off, the direct current voltage source 42 is connected to a grounding unit 44 by the switch 43. A current monitor 42A monitors the current to detect changes such as current spikes and the like. The current monitor 42A may be a separate device as shown in FIG. 1 or may be integrated into controller 100. In the following descriptions, an assumption is made that when the voltage applied to the chuck electrode 40*a* is turned off, the chuck electrode 40*a* is grounded. A heat transferring gas supply source 52 supplies a heat transferring gas such as helium (He) gas or argon (Ar) gas to the rear face of the wafer, W, that is arranged on the electrostatic chuck 40 via a gas supply line 54. In some embodiments, the helium gas may be up to approximately 30 mTorr during processes. The shower head 38 at the ceiling portion includes an electrode plate 56 having plural gas vent holes 56*a* and an electrode support 58 that detachably supports the electrode plate 56. A buffer chamber 60 is arranged within the electrode support 58. The buffer chamber 60 includes a gas inlet 60*a* that is connected to a gas supply source 62 via a gas supply pipe 64. In the example, a desired gas can be supplied to the processing chamber 10 from the shower head 38.

A plurality of support pins 81 (also referred to as lift pins) are arranged within the stage 12 to raise and lower the wafer, W, and transfer the wafer, W, to and from an external transporting arm (not shown). The support pins 81 are driven to move up and down by a lifting actuator 84 (see FIG. 3 for more detail) that is connected to the support pins 81 via a connection member 82. The support pins 81 are arranged to penetrate into a processing volume of the processing chamber 10 via through holes in the stage 12. Bellows 83 are arranged at the bottom of the through holes in the processing chamber 10 in order to maintain an airtight seal of the vacuum within the processing chamber 10 from the external atmosphere. In the plasma processing system 1, a magnet 66 in a two-tier circular or concentric structure is arranged around the processing chamber 10. In a plasma generating space between the shower head 38 and the stage 12 within the processing chamber 10, a vertical RF electric field is created by the high-frequency power source 32 and a high-frequency electric power is discharged so that high density plasma is generated near the surface of the stage 12. A refrigerant pipe 70 is arranged within the stage 12. A refrigerant at a predetermined temperature is supplied to and circulated within the refrigerant pipe 70 from a chiller unit 71 via pipes 72 and 73. In the embodiment of FIG. 1, a heater 75 is embedded in the electrostatic chuck 40. The heater 75 can have an alternating current voltage applied thereon from an alternating current power source (not shown). In the example, the processing temperature of the wafer, W, on the electrostatic chuck 40 can be adjusted to a desired temperature through cooling by the chiller unit 71 and heating by the heater 75.

Further, in the embodiment of FIG. 1, a monitor 80 is arranged to monitor the pressure, P, of the heat transferring gas supplied to the rear face of the wafer, W. The pressure is measured using a pressure sensor (not shown) arranged at the rear face of the wafer, W. The monitor 80 can also monitor the leakage flow rate, F, of the heat transferring gas leaking from the rear face of the wafer, W. The leakage flow rate can be measured by a flow rate sensor (not shown) that is arranged at a side face of the wafer, W. The monitor 80 can be arranged to monitor both the pressure of the heat transferring gas and the leakage flow rate of the heat transferring gas, or the monitor 80 can alternatively be arranged to monitor either one of the above. In the plasma processing system 1, a controller 100 is arranged to control operations of the various units of the plasma processing system 1 such as the gas supply source 62, the exhaust apparatus 28, the heater 75, the direct current voltage source 42, the switch 43, the matching unit 34, the high-frequency power source 32, the heat transferring gas supply source 52, the lifting actuator 84, and the chiller unit 71. Also, the controller 100 can obtain from the monitor 80, the pressure, P, of the heat transferring gas supplied to the rear face of the wafer, W, and the leakage flow rate, F, of the heat transferring gas. Further, the controller 100 can be connected to a host computer (not shown).

Figure 2:
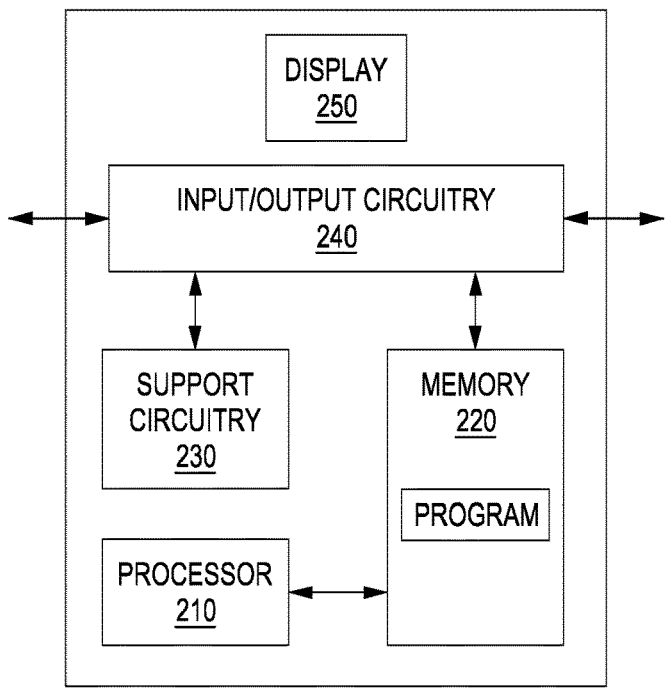
FIG. 2 is a high level block diagram of a controller of FIG. 1 in accordance with some embodiments of the present principles.

The controller 100 includes a CPU (central processing unit), a ROM (read-only memory), and a RAM (random access memory) (not shown), for example. The CPU of the controller 100 executes a plasma process according to a recipe stored in a memory. The recipe includes system control information specifying processing conditions of the plasma process such as the processing time, the processing chamber temperatures (e.g., upper electrode temperature, processing chamber side wall temperature, ESC temperature), the pressure (e.g., gas exhaust pressure), the high-frequency electric power voltage, the flow rates of various processing gases, and the heat transferring gas flow rate, for example. FIG. 2 depicts a high level block diagram of a controller 100 of FIG. 1 in accordance with an embodiment of the present principles. The controller 100 of FIG. 2 illustratively comprises a processor 210, which can include one or more central processing units (CPU), as well as a memory 220 for storing control programs, configuration information, backup data and the like. The processor 210 cooperates with support circuitry 230 such as power supplies, clock circuits, cache memory and the like as well as circuits that assist in executing the software routines/programs stored in the memory 220. As such, some of the process steps discussed herein as software processes may be implemented within hardware, for example, as circuitry that cooperates with the processor 210 to perform various steps. The controller 100 also contains an input-output circuitry and interface 240 that forms an interface between the various functional elements communicating with the controller 100. For example, in some embodiments the input-output circuitry and interface 240 can include or be connected to an optional display 250, a keyboard and/or other user input (not shown). The input-output circuitry and interface 240 can be implemented as a user interface for interaction with the controller 100.

The controller 100 can communicate with other computing devices based on various computer communication protocols such a Wi-Fi, Bluetooth (and/or other standards for exchanging data over short distances includes protocols using short-wavelength radio transmissions), USB, Ethernet, cellular, an ultrasonic local area communication protocol, etc. The controller 100 can further include a web browser. Although the controller 100 of FIG. 2 is depicted as a general purpose computer, the controller 100 is programmed to perform various specialized control functions a specialized, specific computer in accordance with the present principles, and embodiments can be implemented in hardware, for example, as an application specified integrated circuit (ASIC). As such, the process steps described herein are intended to be broadly interpreted as being equivalently performed by software, hardware, or a combination thereof.

Referring back to FIG. 1, to perform etching in the plasma processing system 1 with the above configuration, first, the gate valve 30 is opened so that the wafer, W, held on the transporting arm can be transported into the processing chamber 10. Then, the wafer, W, is raised from the transporting arm by the support pins 81 protruding from the surface of the electrostatic chuck 40 so that the wafer W is held on top of the support pins 81. Then, after the transporting arm exits the processing chamber 10, the support pins 81 are lowered into the electrostatic chuck 40 and the wafer, W, is placed on the electrostatic chuck 40. After transporting the wafer, W, into the processing chamber 10, the gate valve 30 is closed, an etching gas is introduced into the processing chamber 10 from the gas supply source 62 at a predetermined flow rate, and the pressure within the processing chamber 10 is decreased to a predetermined level by the exhaust apparatus 28. Further, a high-frequency electric power at a predetermined level is applied from the high-frequency power source 32 to the stage 12. Also, a voltage from the direct current voltage source 42 is applied to the chuck electrode 40a of the electrostatic chuck 40 so that the wafer, W, can be fixed to the electrostatic chuck 40. The etching gas that is introduced from the shower head 38 is turned into plasma by the high-frequency electric power from the high-frequency power source 32, and in the example, plasma can be generated in the plasma generating space between the upper electrode (shower head 38) and the lower electrode (stage 12). As such, a surface of the wafer, W, can be etched by the radicals and ions within the generated plasma.

In some embodiments, to dechuck the wafer, W, from the electrostatic chuck 40 after completing the plasma etching process, a dynamic voltage sweeping process is implemented. For example, when using positive wafer chucking, trapped charges are negative, which generate electrical field at interface of the ESC and the wafer, W. When high voltage ESC power supply linearly sweeps voltage from negative to positive over a time interval, a reverse electrical field is created at the wafer/ESC interface. Dynamically, the two electrical fields at the wafer/ESC interface cancel each other at some time instant, and the delta voltage is zero volts. At that specific time instant, zero electrical clamping force holds the wafer to the ESC, which triggers an ESC current spike. The inventors have found that if a support pin up command is given by a controller at the time of the ESC current spike, an inherent delay in the time between the command being sent and the actual movement of the support pin may cause the support pins to damage the wafer. The inventors found that a charge may rebuild on the ESC during the time delay between when the ESC current spike is detected and the time the support pins actually move. When the delay occurs, the charge on the ESC holds the wafer downward (chucked) as the support pins try to lift the wafer upwards, causing the wafer to break. The inventors have also found that the delay between commanding the support pins up and the actual movement may be caused by mechanical friction forces in the lifting actuator causing a slow response time. In addition, the time required to fill a volume with a gas to produce an upward force in a lifting actuator such as, for example, an air cylinder, also causes a delay in responding to a lift command. Thus, the inventors have discovered that by pre-loading the support pins with a pressure less than a wafer breaking pressure and/or using a low friction lifting actuator allows the wafer to be released from the ESC at the instant that the charges on the surface of the ESC are canceled and the clamping force reaches zero.

Figure 3:
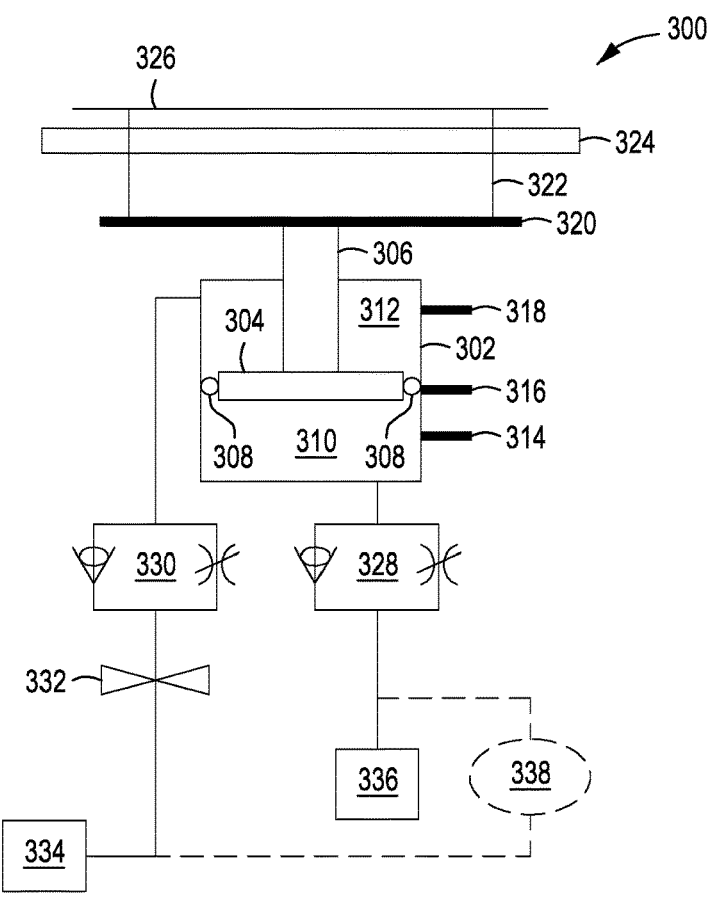
FIG. 3 is a cross-sectional view of a lifting apparatus in accordance with some embodiments of the present principles.

FIG. 3 is a cross-sectional view of a lifting actuator 300 that may be used in some embodiments. Upward and downward forces are applied to support pins 322 by, for example, an air cylinder 302. The air cylinder 302 has a piston 304 that is connected to a piston rod 306 that applies forces to a lift hoop 320. The support pins 322 are mounted to the lift hoop 320 and apply upward pressure to the substrate or wafer 326 when the piston 304 of the air cylinder 302 moves upward, causing the support pins 322 to protrude through the ESC 324 and contact the backside of the wafer 326. The air cylinder 302 has an upper volume 312 and a lower volume 310. The air cylinder 302 is operated by controlling air, or another gas, into and out of the upper volume 312 and the lower volume 310 using upper volume check valves 330 and lower volume check valves 328. For downward pressure, the upper volume 312 is pressurized with a gas. The pressurization of the upper volume forces the gas in the lower volume 310 to be expelled from the lower volume 310. For upward pressure, the lower volume 310 is pressurized with a gas. The pressurization of the lower volume 310 forces the gas in the upper volume 312 to be expelled from the upper volume 312. In some embodiments, an electronic valve (EV) 332 may be in communication with a controller such as controller 100 of FIGS. 1 and 2 to finely tune the upper volume 312 and the lower volume 310 with gas pressures to achieve the correct operational pressure on the wafer 326 to perform a given task. In some embodiments, the controller 100 may be programmed to shut off a down position EV immediately after evacuation of a heat transferring gas (e.g., helium, argon gas) from behind the wafer 326 and prior to the dechucking process to provide an upward force on the support pins 322 and the backside of the wafer 326.

In some embodiments, the upper volume 312 may be connected to a high pressure gas supply 334. The high pressure gas supply 334 may provide a gas with a pressure ranging from greater than zero to approximately 80 psi. In some embodiments, the lower volume 310 may be connected to a low pressure or atmospheric pressure gas supply 336. In some embodiments, a pressure regulator 338 may be connected to the high pressure gas supply 334 to increase the pressure in the lower volume 310 above what is supplied by the low pressure or atmospheric pressure gas supply 336. In some embodiments, the pressure regulator 338 may be used to supply more than zero to less than 3 psi above the atmospheric pressure from the lower pressure or atmospheric pressure gas supply 336. In some embodiments, the pressure regulator 338 may be used to supply approximately 1 psi above the atmospheric pressure from the lower pressure or atmospheric pressure gas supply 336.

The inventors have discovered that a response time delay between when the air cylinder is commanded to move upward and when the upward motion actually occurs, can be decreased by using low friction air cylinders. The use of a low friction lifting actuator also prevents wafer breakage from a higher friction lifting actuator that cause the lifting pins to jump and hit the wafer when pressure is applied to the high friction lifting actuator. The force behind a high friction device has to overcome the high friction before, for example, a piston in an air cylinder can cause the piston to move—causing a sudden jump in the support pins when the friction force finally is overcome. In some embodiments, the low friction air cylinders may utilize glass liners. In addition, the use of low friction seals 308 on the piston 304 such as, for example, graphite seals, also decreases the response time delay. In some embodiments, the low friction air cylinders operate with a friction of greater than zero to approximately 0.2 psi. The low friction allows the air cylinder to be more responsive to lifting commands from the controller 100 and, more likely to lift the wafer at the moment that the ESC current spike is detected. The air cylinder 302 may also include a low position sensor 314 that detects when the piston 304 is in a lowered or chucked position (and subsequently the wafer 326 is resting on the ESC 324) and an up position sensor 318 that detects when the piston 304 is in an up or transfer position (and subsequently the wafer 326 is lifted above the ESC 324 and ready to be removed from the processing chamber). In some embodiments, an intermediate lift position sensor 316 may be used to detect when the piston 304 is moving between the lowered position and the up position.

Figure 4:
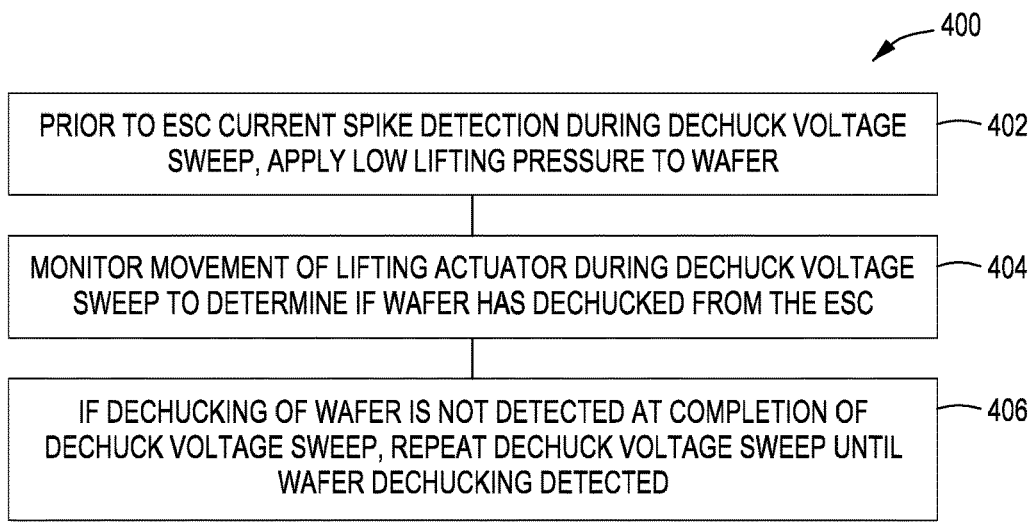
FIG. 4 is a method for dechucking a wafer in accordance with some embodiments of the present principles.

FIG. 4 is a method 400 for dechucking a wafer in accordance with some embodiments. In block 402, a constant low lifting pressure is applied to a wafer prior to an ESC current spike detection during a dechuck voltage sweep. The low lifting pressure may be from approximately zero psi (atmospheric pressure) to approximately 1 psi as applied to the lifting actuator. In some embodiments, the pressure applied to the lifting actuator may be adjusted above atmospheric pressure to enhance throughput of the process by lifting the wafers faster to speed up the dechucking process. Atmospheric pressure applied to the lifting actuator (e.g., cylinder bore) applies approximately 5 pounds of force to the wafer which is less than a breaking force of the wafer. A breaking force of the wafer occurs when the force applied to, for example, the cylinder bore of the lifting actuator is 3 psi or above. In some embodiments, a gas (e.g., heat transferring gas) supplied to the backside of the wafer such as, for example, helium or argon gas is reduced in pressure to approximately zero psi while applying the constant low lifting pressure to the wafer and prior to or after the beginning of the dechuck voltage sweep. During the dechuck voltage sweep, a linearly ramped voltage is applied to the ESC while the current of the ESC is monitored. A spike in the ESC current may indicate that a zero voltage has been reached on the ESC surface and that a wafer may be dechucked at that moment. By applying a constant low lifting pressure to the wafer prior to the occurrence of the ESC current spike, the wafer is able to dechuck at or near the moment of the ESC current spike. In some embodiments, a low friction air cylinder used for the lifting actuator significantly increases the responsiveness of the lifting actuator to lift the wafer at the moment of zero voltage on the ESC surface. In some embodiments, the friction of the air cylinder is greater than zero to approximately 0.5 psi. In some embodiments, the friction of the air cylinder is approximately 0.2 psi or less.

In block 404, the movement of the lifting actuator is monitored during the dechuck voltage sweep to determine if the wafer has dechucked from the surface of the ESC. In some embodiments, a sensor such as, for example, an intermediate lifting position sensor may be used to detect that the lifting actuator has lifted the wafer from the surface of the ESC. In some embodiments, movement of a piston of an air cylinder may be detected as an indication that the wafer has been dechucked. In block 406, if the wafer dechucking has not been detected and the dechuck voltage sweep has completed, the dechuck voltage sweep is repeated until the wafer is dechucked. The constant low lifting pressure is maintained during the one or more dechuck voltage sweeps until the wafer is dechucked.

Figure 5:
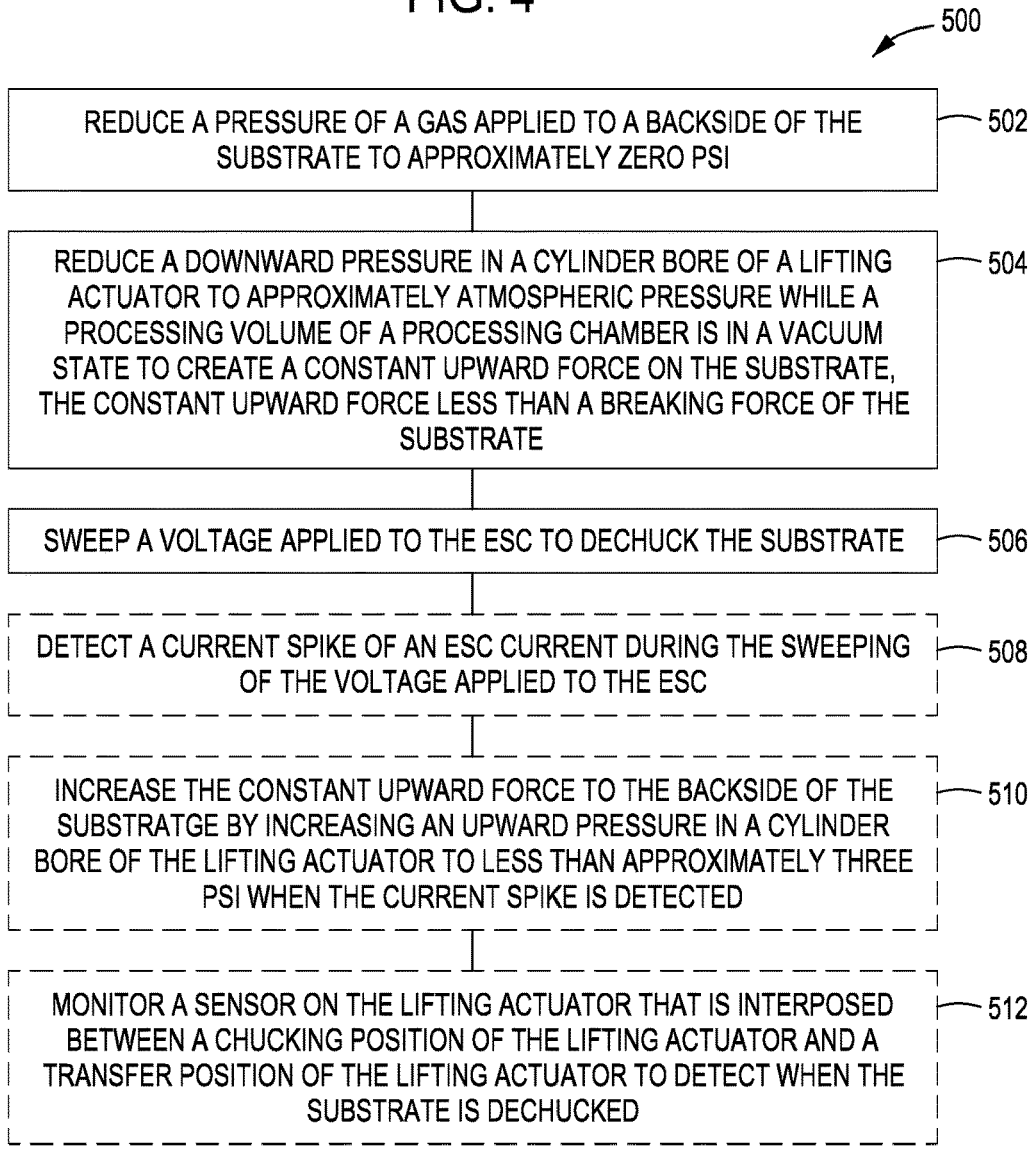
FIG. 5 is another method for dechucking a wafer in accordance with some embodiments of the present principles.

FIG. 5 is another method 500 for dechucking a wafer in accordance with some embodiments. In block 502, a pressure of a gas (e.g., heat transferring gas) applied to a backside of the wafer is reduced to approximately zero psi (atmospheric pressure). In some embodiments, the gas may be helium or argon and the like. Reducing the pressure of the backside gas reduces the overall pressure being applied to the backside of the wafer on the ESC. In block 504, a downward pressure in a cylinder bore of a lifting actuator is reduced to approximately atmospheric pressure while a processing volume of a processing chamber is in a vacuum state to create a constant upward force on the wafer. The constant upward force is less than a breaking force of the wafer. Because the downward pressure in the cylinder bore of the lifting actuator is at atmospheric pressure and the processing volume is in a vacuum (less pressure than atmospheric pressure), a constant upward pressure is applied to the backside of the wafer. The constant upward pressure will 'pop' the wafer from the surface of the ESC when a voltage level on the surface of the ESC reaches zero.

In block 506, a voltage applied to the ESC is dynamically swept in a linear fashion to dechuck the wafer. When the voltage sweep zeros the charge on the surface of the ESC, the constant pressure will cause the wafer to automatically dechuck. In optional block 508, a current spike of an ESC current is detected during the sweeping of the voltage applied to the ESC. The current spike occurs at the moment that the charge on the surface of the ESC reaches zero. The current spike may also indicate the moment when the wafer is automatically dechucked due to the presence of the constant upward pressure on the backside of the wafer by the lifting actuator. In optional block 510, the constant upward force to the backside of the wafer is increased by increasing an upward pressure in a cylinder bore of the lifting actuator to approximately three psi or less when the current spike is detected. The increase in upward pressure may increase the dechucking speed of the wafer and further help to increase throughput of the processing chamber. The increase in upward pressure is optional and may not occur in some embodiments of the present principles. If the wafer has not dechucked, the increase in upward pressure is still less than the breaking force of the wafer and will not damage a chucked wafer. In optional block 512, a sensor on the lifting actuator that is interposed between a chucking position of the lifting actuator and a transfer position of the lifting actuator is monitored to detect when the wafer is dechucked. The sensor detects when a piston in a lifting actuator moves from a chucking position to a transfer position. If the sensor does not indicate that the wafer was dechucked, the process may be repeated until the wafer is dechucked as the exerted pressures are not high enough to damage or break a chucked wafer.

Figure 6:
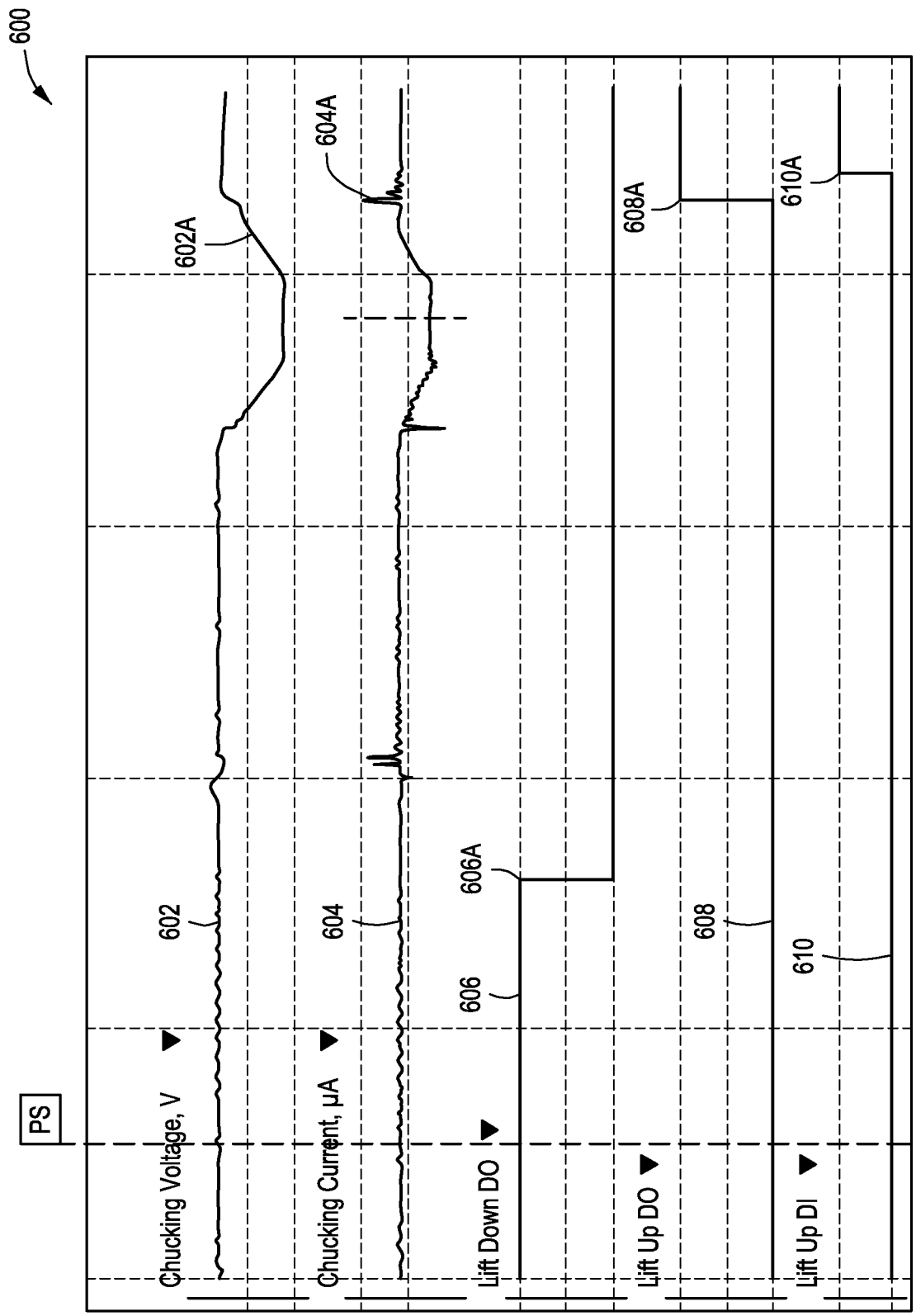
FIG. 6 is a timing diagram in accordance with some embodiments of the present principles.

In FIG. 6 is a timing diagram 600 in accordance with some embodiments. A chucking voltage 602 is applied to the ESC to chuck a wafer to the ESC. During dechucking, the chucking voltage 602 is adjusted to a negative voltage and then the voltage is linearly ramped upward as indicated by point 602A. The chucking current 604 is monitored during the dechucking process to detect any current spikes such as the one indicated at point 604A. A controller for the chucking and dechucking processes may be used such as controller 100 described above. While the wafer is chucked, a lift down digital output (DO) command 606 is high. The lift down DO commands the lifting actuator to force the lifting pins downward. Prior to the dechucking process, the lift down DO command 606 is set low at point 606A to allow the downward pressure on the lifting actuator to float (upper volume valve opened on an air cylinder) or go to zero psi (e.g., atmospheric pressure).

While the wafer is chucked, a lift up DO command 608 is set low to allow, for example, a valve of a lower volume of an air cylinder to vent to atmosphere. With the lift down DO command 606 set low and the lift up DO command 608 set low, a lifting actuator such as an air cylinder will have the piston floating in the air cylinder because the upper volume above the piston and the lower volume below the piston are at zero psi or atmospheric pressure. Because the processing chamber is generally in a vacuum state during the dechucking process, the lifting actuator will maintain a constant low lifting pressure on the wafer prior to the ESC current spike (at point 604A). The constant low lifting pressure is less than a wafer breaking pressure. In some embodiments, the lifting actuator may increase the lower volume pressure from greater than zero psi (atmospheric pressure) to approximately 1 psi. The increase in low pressure allows for a faster lift when an ESC current spike occurs but is less than a wafer breaking pressure.

When the ESC current spike (at point 604A) is detected, the lift up DO command 608 may be set high at point 608A to increase the pressure in the lower volume of the air cylinder. In some embodiments, the increased pressure may be greater than zero psi to approximately 3 psi or less. The increased pressure assists in lifting the wafer from the ESC surface when dechucking. In some embodiments, a lift up digital input (DI) 610 may go from low to high at point 610A and be used to indicate when the wafer has dechucked. In some embodiments, the lift up DI may come from a sensor, such as the intermediate sensor, that detects when a piston of an air cylinder is moving upwards and subsequently indicates that the lift pins are moving the wafer off of the ESC.

While the foregoing is directed to embodiments of the present principles, other and further embodiments of the principles may be devised without departing from the basic scope thereof.

The invention claimed is:

1. A method for dechucking a wafer from a surface of an electrostatic chuck (ESC) in a processing chamber, comprising:
   sweeping a voltage applied to the ESC to dechuck the wafer; and
   applying a constant upward force to a backside of the wafer chucked in the ESC with a lifting actuator prior to an occurrence of an ESC current spike caused by the sweeping of the voltage applied to the ESC, the constant upward force less than a breaking force of the wafer.

2. The method of claim 1, further comprising:
   monitoring a sensor on the lifting actuator that is interposed between a chucking position of the lifting actuator and a transfer position of the lifting actuator to detect when the wafer is dechucked.

3. The method of claim 1, wherein the constant upward force is provided by atmospheric pressure applied to a cylinder bore of the lifting actuator.

4. The method of claim 3, wherein the constant upward force is increased by up to approximately 1 psi above atmospheric pressure.

5. The method of claim 1, further comprising:
   detecting a current spike of an ESC current during the sweeping of the voltage applied to the ESC; and
   increasing the constant upward force to the backside of the wafer by increasing an upward pressure in a cylinder bore of the lifting actuator to up to approximately three psi when the current spike is detected.

6. The method of claim 1, further comprising:
   reducing a pressure of a gas applied to the backside of the wafer to approximately zero psi; and
   applying the constant upward force to the wafer prior to the sweeping of the voltage applied to the ESC.

7. The method of claim 1, wherein the constant upward force exerts up to approximately 5 pounds of force applied to the wafer.

8. The method of claim 1, wherein the lifting actuator is a low air cylinder.

9. The method of claim 8, wherein the low friction air cylinder has a glass cylinder liner and a graphite piston seal.

10. The method of claim 1, further comprising:
    reducing a downward pressure on a cylinder bore of the lifting actuator to approximately atmospheric pressure while a processing volume of the processing chamber is in a vacuum state to provide the constant upward force on the wafer.

11. A method for dechucking a wafer from a surface of an electrostatic chuck (ESC) in a processing chamber, comprising:
    reducing a pressure of a gas applied to a backside of the wafer to approximately zero psi;
    reducing a downward pressure in a cylinder bore of a lifting actuator to approximately atmospheric pressure while a processing volume of the processing chamber is in a vacuum state to create a constant upward force on the wafer, the constant upward force less than a breaking force of the wafer; and
    sweeping a voltage applied to the ESC to dechuck the wafer.

12. The method of claim 11, further comprising:
    detecting a current spike of an ESC current during the sweeping of the voltage applied to the ESC; and
    increasing the constant upward force to the backside of the wafer by increasing an upward pressure in a cylinder bore of the lifting actuator to less than approximately three psi when the current spike is detected.

13. The method of claim 11, further comprising:
    monitoring a sensor on the lifting actuator that is interposed between a chucking position of the lifting actuator and a transfer position of the lifting actuator to detect when the wafer is dechucked.

14. The method of claim 11, wherein the constant upward force is increased by approximately 1 psi or less above atmospheric pressure.

15. The method of claim 11, wherein the constant upward force exerts up to approximately 5 pounds of force applied to the wafer.

16. The method of claim 11, wherein the lifting actuator is a low friction air cylinder.

17. The method of claim 16, wherein the low friction air cylinder has a glass cylinder liner and a graphite piston seal.

18. The method of claim 16, wherein the low friction air cylinder operates with approximately 0.2 psi or less.

19. An apparatus for dechucking a wafer from a surface of an electrostatic chuck (ESC) in a processing chamber, comprising:
    a processing chamber comprising an ESC, and a plurality of support pins to support the wafer;
    a current monitor to monitor a current of the ESC;
    a power source to provide a voltage to the ESC; and
    a controller comprising a processor and a memory coupled to the processor, the memory having stored therein at least one of programs or instructions executable by the processor to configure the controller to:
    reduce a pressure of a gas applied to a backside of the wafer to approximately zero psi;

reduce a downward pressure in a cylinder bore of a lifting actuator to approximately atmospheric pressure while a processing volume of the processing chamber is in a vacuum state to create a constant upward force on the wafer, the constant upward force less than a breaking force of the wafer; and sweep a voltage applied to the ESC to dechuck the wafer.

20. The apparatus of claim 19, wherein the controller is further configured to:

detect a current spike of an ESC current during the sweep of the voltage applied to the ESC;

increase the constant upward force to the backside of the wafer by increasing an upward pressure in a cylinder bore of the lifting actuator to less than approximately three psi when the current spike is detected; and monitor a sensor on the lifting actuator that is interposed between a chucking position of the lifting actuator and a transfer position of the lifting actuator to detect when the wafer is dechucked.

\* \* \* \* \*

UNITED STATES PATENT AND TRADEMARK OFFICE
CERTIFICATE OF CORRECTION

PATENT NO. : 11,171,030 B2
APPLICATION NO. : 16/403850
DATED : November 9, 2021
INVENTOR(S) : Noorbakhsh et al.

Page 1 of 1

It is certified that error appears in the above-identified patent and that said Letters Patent is hereby corrected as shown below:

In the Claims

In Claim 8, Column 12, Line 10, delete "low" and insert --low friction--

Signed and Sealed this
Twenty-eighth Day of December, 2021

Drew Hirshfeld
*Performing the Functions and Duties of the*
*Under Secretary of Commerce for Intellectual Property and*
*Director of the United States Patent and Trademark Office*